US006876272B2

(12) United States Patent
DeLisio, Jr. et al.

(10) Patent No.: US 6,876,272 B2
(45) Date of Patent: Apr. 5, 2005

(54) REFLECTION-MODE, QUASI-OPTICAL GRID ARRAY WAVE-GUIDING SYSTEM

(75) Inventors: Michael P. DeLisio, Jr., Monrovia, CA (US); Blythe C. Deckman, Corona, CA (US); James J. Rosenberg, Monrovia, CA (US)

(73) Assignee: Wavestream Wireless Technologies, San Dimas, CA (US)

(*) Notice: Subject to any disclaimer, the term of this patent is extended or adjusted under 35 U.S.C. 154(b) by 0 days.

(21) Appl. No.: 10/001,127

(22) Filed: Oct. 23, 2001

(65) Prior Publication Data

US 2003/0076192 A1 Apr. 24, 2003

(51) Int. Cl.[7] .............................. H01P 5/12; H03F 3/60

(52) U.S. Cl. ..................... 333/125; 333/21 A; 333/250; 330/286

(58) Field of Search ................................ 333/125, 134, 333/137, 202, 21 A, 250; 343/755, 756, 909; 330/286, 295

(56) References Cited

U.S. PATENT DOCUMENTS 3,574,438 A * 4/1971 Carson ...................... 333/81 B
3,649,934 A * 3/1972 Matthaei et al. ............ 333/202
4,291,278 A * 9/1981 Quine ......................... 330/286
5,170,169 A * 12/1992 Stephan ....................... 342/179
5,214,394 A * 5/1993 Wong .......................... 330/288
5,317,173 A * 5/1994 Sovero ........................ 257/197
5,481,223 A * 1/1996 Wong ...................... 330/124 R
5,515,009 A * 5/1996 Wong et al. ................ 330/286
5,736,908 A * 4/1998 Alexanian et al. .......... 333/125
5,828,344 A * 10/1998 Alder et al. ................ 343/755
2002/0018282 A1 * 2/2002 Rosenberg et al. .......... 359/276
2002/0021865 A1 * 2/2002 Cheung ....................... 385/28

OTHER PUBLICATIONS

Lecuyer et al., 2000, IEEE, 4 pages.*

DeLisio, Michael P., et al., "Modeling and Performance of a 100–Element pHEMT Grid Amplifier," *IEEE Transactions on Microwave Theory and Techniques*, vol. 44, No. 12, pp. 2136–2144, Dec. 1996.

Guyette, Andrew, et al., "A 16–Element Reflection Grid Amplifier With Improved Heat Sinking,".

Kamei, Toshihisa, et al., "Design and Simulation of a Mode Converter for the Excitation of Quasi–Optical Amplifiers," *International Symposium on Antennas and Propagation*, Fukuoka, Japan, Aug. 2000.

Kim, M., et al., "A 100–Element HBT Grid Amplifier," *IEEE Transactions on Microwave Theory and Techniques*, vol. 41, No. 10, pp. 1762–1771, Oct. 1993.

Kim, Moonil, et al., "A Grid Amplifier," *IEEE Microwave and Guided Wave Letters*, vol. 1, No. 11, p. 322, Nov. 1991.

Lecuyer, Frederick, et al., "A 16–Element Reflection Grid Amplifier," *IEEE*, 2000.

Sovero, E. A., et al., "A Ka–Band Monolithic Quasi–Optic Amplifier," *IEEE*, May, 1998.

Swisher, Robert R., et al., "A Balanced Diode Grid Mixer," *IEEE*, May, 1999.

* cited by examiner

*Primary Examiner*—Robert Pascal
*Assistant Examiner*—Dean Takaoka
(74) *Attorney, Agent, or Firm*—Sidley Austin Brown & Wood LLP

(57) ABSTRACT

The present invention discloses a system for integrating a quasi-optical reflection-mode array into a wave-guiding enclosure. The system includes a quasi-optical reflection mode array and a waveguide assembly that encloses and mounts therein the array. In one preferred embodiment, the waveguide assembly includes an array mounting section into which the array is mounted, a first energy coupling section, a second energy coupling section and a three-port waveguide section. The wave-guiding section has a first port connected to the first energy coupling section, a second port connected to the second energy coupling section, and a third port connected to the array mounting section.

3 Claims, 5 Drawing Sheets

REFLECTION-MODE, QUASI-OPTICAL GRID ARRAY WAVE-GUIDING SYSTEM

BACKGROUND OF THE INVENTION

1. Field of the Invention

This invention relates to quasi-optic grid arrays, such as periodic grid arrays, and in particular to systems for adapting a wave-guide assembly to a reflection-mode quasi-optical grid array.

2. Description of Related Art

Broadband communications, radar and other imaging systems require the transmission of radio frequency ("RF") signals in the microwave and millimeter wave bands. In order to efficiently achieve the levels of output transmission power needed for many applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, spatial power combining using "quasi-optics" was proposed as a potential solution to these problems. The theory was that an array of microwave or millimeter-wave solid state sources placed in a resonator could synchronize to the same frequency and phase, and their outputs would combine in free space, minimizing conductor losses. Furthermore, a planar array could be fabricated monolithically and at shorter wavelengths, thereby enabling potentially thousands of devices to be incorporated on a single wafer or chip.

Since then, numerous quasi-optical devices have been developed, including detectors, multipliers, mixers, and phase shifters. These passive devices continue to be the subject of ongoing research. Over the past few years, however, active quasi-optical devices, namely oscillators and amplifiers, have evolved. One benefit of spatial power combining (over other methods) using quasi-optics is that the output power scales linearly with chip area. Thus, the field of active quasi-optics has attracted considerable attention in a short time, and the growth of the field has been explosive.

A quasi-optical array amplifier is a two-dimensional sheet of active devices that accepts a polarized electromagnetic wave as an input and radiates an amplified output wave with a polarization that is orthogonal to the input polarization. Two array amplifier configurations have been previously reported: transmission-mode arrays and reflection-mode arrays. FIG. 1 shows a typical transmission-mode grid amplifier 10, wherein an array of closely-spaced differential pairs of transistors 14 on an active grid 12 having a front and back side and is sandwiched between an input polarizer 18 and an output polarizer 24. An input signal 16 passes through the horizontally polarized input polarizer 18 and creates an input beam incident from the left (onto the front side) that excites RF currents on the horizontally polarized input antennas 20 of the grid 12. These currents drive the inputs of the transistor pair 14 in the differential mode. The output currents are redirected along the grid's vertically polarized antennas 22, producing, out the back (right) side of the array, a vertically polarized output beam 30 via an output polarizer 24.

Numerous grid amplifiers have since been developed and have proven thus far to have great promise for both military and commercial RF applications and particularly for high frequency, broadband systems that require significant output power levels (e.g.>5 watts) in a small, preferably monolithic, package. Moreover, a resonator can be used to provide feedback to couple the active devices to form a high power oscillator.

Grid amplifiers can be characterized as quasi-plane wave input, quasi-plane wave output (free space) devices. Grid oscillators are essentially quasi-plane wave output devices. However, most microwave and millimeter wave systems transport signals through electrical waveguides, which are devices that have internal wave-guiding cavities bounded by wave-confining, and typically electrically conducting, walls. Consequently, an interface between the two environments is needed in most cases. This interface is needed whether the electric field signal is being fed from a waveguide for effective application to the grid array; or the free space output signal of a grid array is to be collected into a waveguide.

Unfortunately, waveguide-enclosed quasi-optical grid arrays based on transmission-mode architectures are less than ideal. Transmission mode arrays are difficult to mount, because the flat grid arrays must be suspended and precisely aligned in the waveguide while allowing the input and output radiation access to both sides of the array. Another problem is that adequate heat dissipation in transmission-mode configurations, a critical design consideration, especially for high-power, high frequency systems, is difficult to achieve because almost all of the surface area of the array, namely the front and back sides, are used for accepting and delivering the input and output radiation, and thus may not be obscured by a heat dissipater or spreader.

In contrast, reflection-mode arrays require that the radiation have access to only one side of the array. The exemplary reflection-mode array shown in FIG. 2 is a grid amplifier 40 that includes an array of closely-spaced differential pairs of transistors 56 on a two-dimensional active grid 50 that is similar to the active grid 12 used in the transmission-mode architecture shown in FIG. 1. The grid has a front side 52 that is exposed to the environment and a back side 54. The back side of the array is mounted on a reflective mirror. In the example shown in FIG. 2 the mirror doubles as a large heat sink, and is thus referred to as mirror/heat sink component 58. Without passing through a polarizing filter, an input beam 60 (i.e. the signal to be amplified) is incident from the right onto the front side of the array. As in the transmission-mode array, the input beam excites RF currents on the horizontally polarized input antennas of the grid and these currents drive the inputs of the transistor pairs in the differential mode. The currents are redirected along the grid's vertically polarized antennas producing, out the back (left) side 54 of the array. However, in the reflection-mode array, the amplified output beam reflects off of the mirror of the mirror/heat sink component 58 and retransmits back through and out front side 52 of the array to free space, as an orthogonally-polarized output beam 62.

As seen, external polarizers are not needed and heat can be drawn away from the grid via nearly 50% of the array surface, since the entire back side area of the grid array is covered by the heat sink/spreader component 58. The reflection-mode architecture is a particularly attractive alternative to transmission-mode architectures because it can result in a more compact structure with the potential for vastly improved heat dissipation properties. More particularly, each unit cell in the array conducts heat directly though the back side substrate to the heat sink, thereby avoiding large temperature rises in the center of the array.

Unfortunately, however, previously reported implementations of reflection-mode grid amplifiers, See e.g., Lecuyer et al., "A 16-Element Reflection Grid Amplifier," 2000 *IEEE MTT-S Int. Microwave Symp. Dig.,* pp. 809-812, Boston, Mass. June, 2000, have not fully taken advantage of these potential benefits. One reason is that they have not been integrated into any enclosure. Rather, the input and output signals are typically fed from free space with, for example, radiating horn antennas. Moreover, these implementations were physically large, suffered very high input and output losses, and poor heat dissipation.

Thus, there is a definite need for simple, compact and cost effective integrated waveguide assembly that efficiently mounts and encloses a reflection-mode quasi-optical grid array with improved heat dissipation.

SUMMARY OF THE INVENTION

The present invention, which addresses these needs, resides in a system in which a reflection-mode quasi-optic grid array is integrated within a waveguide assembly. The system disclosed includes a quasi-optical reflection mode array, which may be a high-frequency amplifier, mixer or other appropriate active grid component, and a waveguide assembly that encloses and mounts therein the array. In the preferred embodiments, the waveguide assembly includes four components, namely, an array mounting section to which the array is mounted, a first energy coupling section, a second energy coupling section and a three-port waveguide section having a first port connected to the first energy coupling section, a second port connected to the second energy coupling section, and a third port connected to the array mounting section. Each of the first and second energy coupling sections and the three-port waveguide section has walls that define a waveguide cavity. The array mounting section may include walls that define a waveguide cavity or may simply be a structure, such as a wall, that may act as a heat sink, to which the array mounts.

This design advantageously provides an efficient means for mounting and securing the array and for removing heat from the array. The three-port waveguide section may be an orthogonal mode transducer (OMT) section, that has mode separating capabilities or may simply be a waveguide "T" section that has no such capacities.

In one embodiment, the first energy coupling section of the assembly is an input tuning section having an input that accepts an input signal and an output connected to the first port of the three-port waveguide section, such that input tuning section couples the input signal to the array. The second energy coupling section is an output tuning section having an input connected to the second port of the waveguide section that accepts a signal from the array and an output that supplies the signal from the array and out of the system.

In another embodiment, the first energy coupling section is an RF input tuning section that accepts an RF input signal, the second energy coupling section is a local oscillator tuning section that accepts a local oscillator signal and the grid array is a mixer that combines the RF and local oscillator signals to produce an intermediate frequency (IF) signal. In this embodiment, the system may further include output line connected to the array that provides an output for the IF signal.

More particularly, the system may further include a heat spreader adapted to dissipate heat generated by the array and the array may be a quasi-optical grid array having front and back sides, such that the heat spreader is mounted to the back side of the array. This is the preferred disclosed means by which the reflection-mode array can advantageously dissipate a significantly greater amount of heat than can a similarly sized transmission-mode array. The heat spreader may also include a wave-reflecting mirror component mounted to it.

In an alternative embodiment, the first energy coupling section is offset from the second energy coupling section by a predetermined angle, such as a 90 degree angle, in order to isolate the first and second signal from each other.

The present invention also discloses a waveguide assembly for integrating therein a reflection-mode array. The assembly includes an array mounting section adapted to mount thereto the array, a first energy coupling section, a second energy coupling section, and a three-port waveguide section having a first port connected to the first energy coupling section, a second port connected to the second energy coupling section, and a third port connected to the array mounting section.

A method of improving the performance of a reflection-mode quasi-optical array having a front side for receiving an electromagnetic input beam and a back side, is also disclosed. The method includes inserting the array into an enclosed wave-guiding assembly having a heat dissipating wall and mounting the back side of the array to the heat dissipating wall of the assembly.

DETAILED DESCRIPTION OF THE PREFERRED EMBODIMENTS

The invention disclosed here is an integrated, fully-enclosed, reflection-mode, quasi-optical array wave-guiding system. The reflection-mode quasi-optical array that may be integrated with the wave guiding structure should be broadly understood to include any grid that can be designed in reflection-mode, including, for example, quasi-optical amplifiers, phase shifters, multipliers, oscillators and mixers. Further, the wave-guiding structure may take numerous shapes and forms. Thus, the following-described embodiments are merely exemplary implementations of the present invention.

Figure 1:
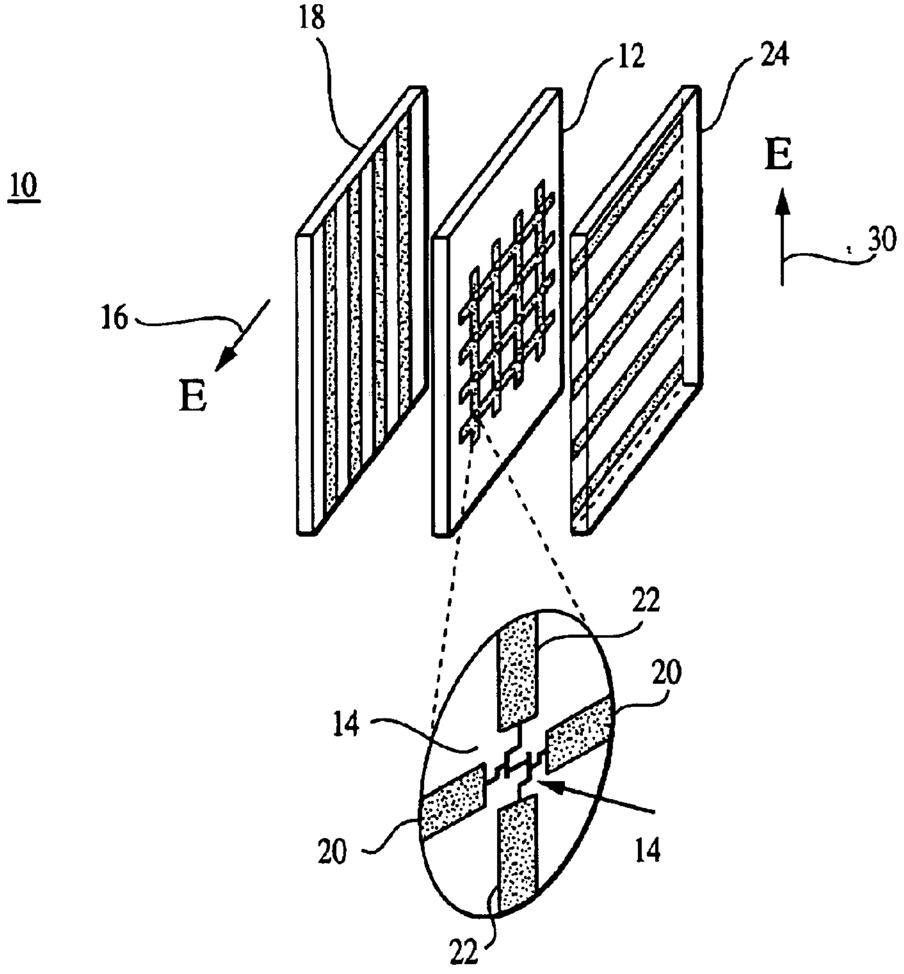
FIG. 1 PRIOR ART
FIG. 1 is an exploded view of a conventional transmission mode quasi-optical grid array with one of the differential pair unit cells in the array magnified.
Figure 2:
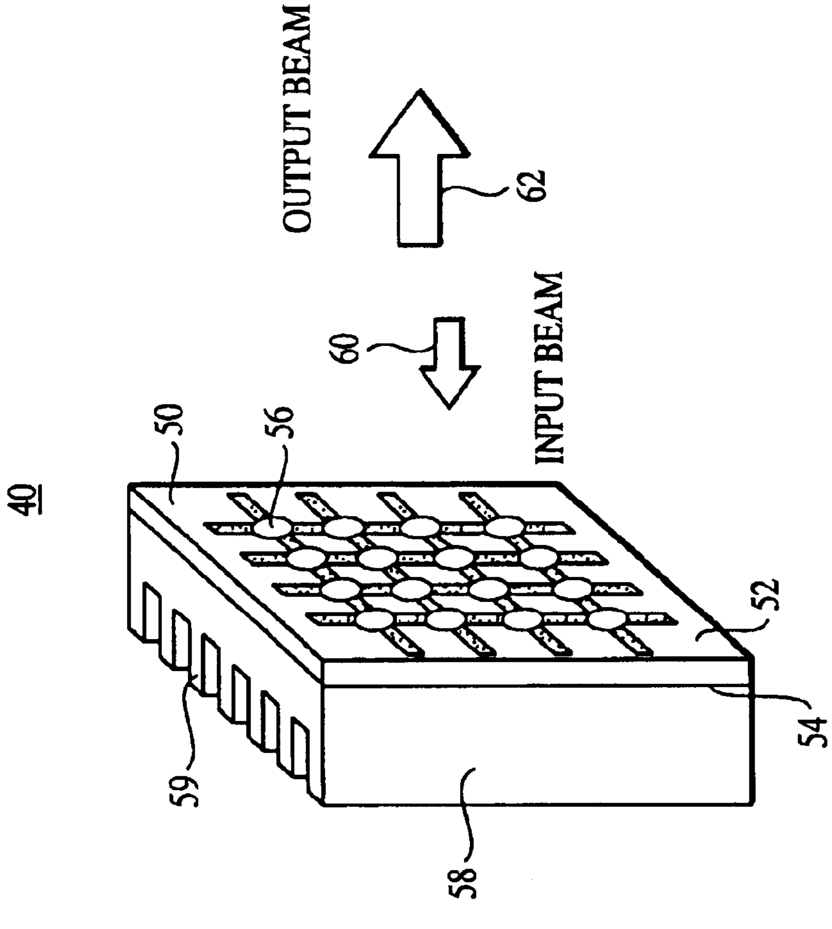
FIG. 2 is a perspective view of a reflection mode quasi-optical grid array.
Figure 3:
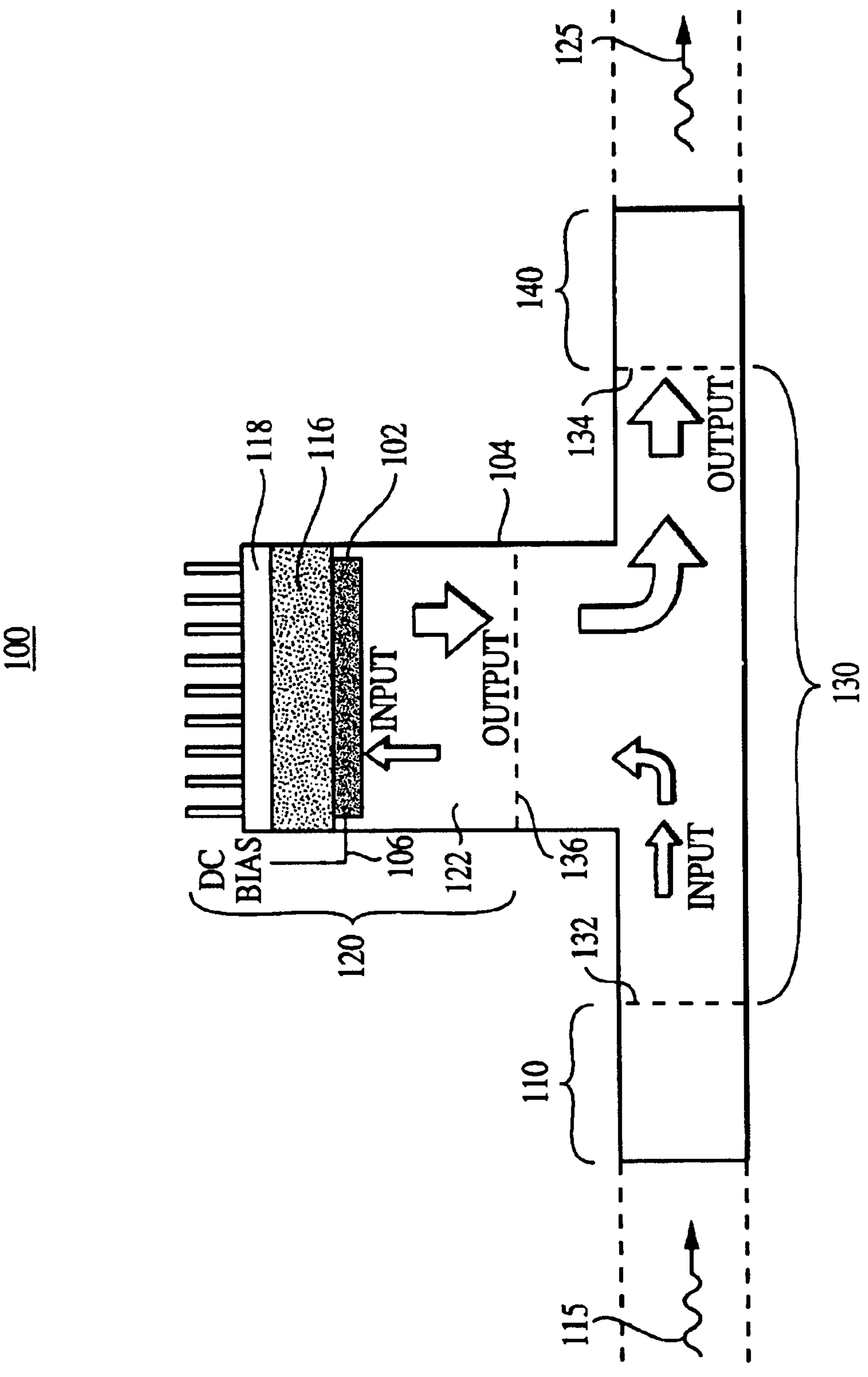
FIG. 3 is a cross-sectional view of one embodiment the quasi-optical reflection-mode waveguide system of the present invention, wherein the reflection-mode array is an amplifier.

FIG. 3 shows a cross-sectional view of one embodiment of the present invention, wherein the reflection-mode quasi-optical array waveguide system 100 includes a reflection-mode amplifier array 102 enclosed in a waveguide enclosure or assembly 104. The waveguide assembly 104 includes four main sections, namely, an input tuning section 110, an array mounting section 120, an orthogonal-mode transition (OMT) section 130 having first, second and third ports 132, 134 and 136, respectively, and an output tuning section 140. Each section has walls that define a waveguide cavity. The output of the input tuning section is connected to the first port 132 of the OMT section, the input of the output tuning section is connected to the second port 134 of the OMT section, and the array mounting section 120 is connected to the third port 136 of the OMT, thereby creating an integrated, fully-enclosed, structure.

The array mounting section 120 securely mounts and fully encloses within its cavity 122 the reflection-mode array amplifier 102 which, as discussed above, has a back side that is mounted to a heat spreader component 116, which could be some dielectric, such as ceramic, whose back side may or may not be mirrored or metallized, which itself is mounted to a heat sink 118.

In operation, an input signal 115 supplied from a waveguide, wave-guiding component, or free space (e.g. from an antenna) (not shown) is input into the input tuning section 110. In the case where the input signal is supplied by a waveguide or other wave-guiding structure, the wave-guiding structure would typically have a flange that securely mounts it to a mating flange at the input side of the input tuning section. The signal then enters the OMT section 130. As seen, the OMT section routes the input signal to the array 102 in active array mounting section 120. The active array amplifies the signal, orthogonally polarizes it, and radiates the signal as an output wave, denoted by the relatively thick arrow. The OMT section routes the output wave 125 through its the second port 134, into and through the output tuning section 140, to an output waveguide or other wave-guiding component, or antenna (not shown). This system results in a compact, efficient amplifier with very good thermal properties.

The input and output tuning sections 110, 140 are used to couple energy into and out of the array, typically, but not necessarily, via impedance matching. It should be understood that the tuning sections may or may not provide adjustable impedance matching. Examples of commonly used tuning sections include adjustable sliding screws, adjustable stubs, and waveguide irises or steps. These sections can also provide tuning of the amplifier's frequency response, and can be adjusted for gain, noise figure, or output power.

The array mounting section 120 physically supports the amplifier array 102, removes the heat dissipated in the array, and reflects the radiated input and output microwave energy. Furthermore, the necessary dc bias is supplied via a dc bias line 106 through this section. The amplifier array 102 is mounted in the section, along with any dielectric matching and heat spreading structures 116. Excess heat generated in the amplifier array is ultimately conducted to the array mounting section's walls, which can be thick and can support cooling fins or coolant channels for improved thermal dissipation. As seen, the heat-conduction path is very short, resulting in excellent thermal properties.

The OMT section 130 shown in FIG. 3 is based on a commonly used waveguide component. The primary function of the OMT section is to separate the orthogonally polarized input and output signals. This section combines orthogonally polarized waves from two single-polarization sections (in the present configuration these are the input and output sections) into a third dual-polarization section (in the present configuration this is the grid amplifier array 102), which joins to the array mounting section 120. The two single-polarization sections are isolated from each other. Thus, energy from one will not couple to the other.

Figure 4:
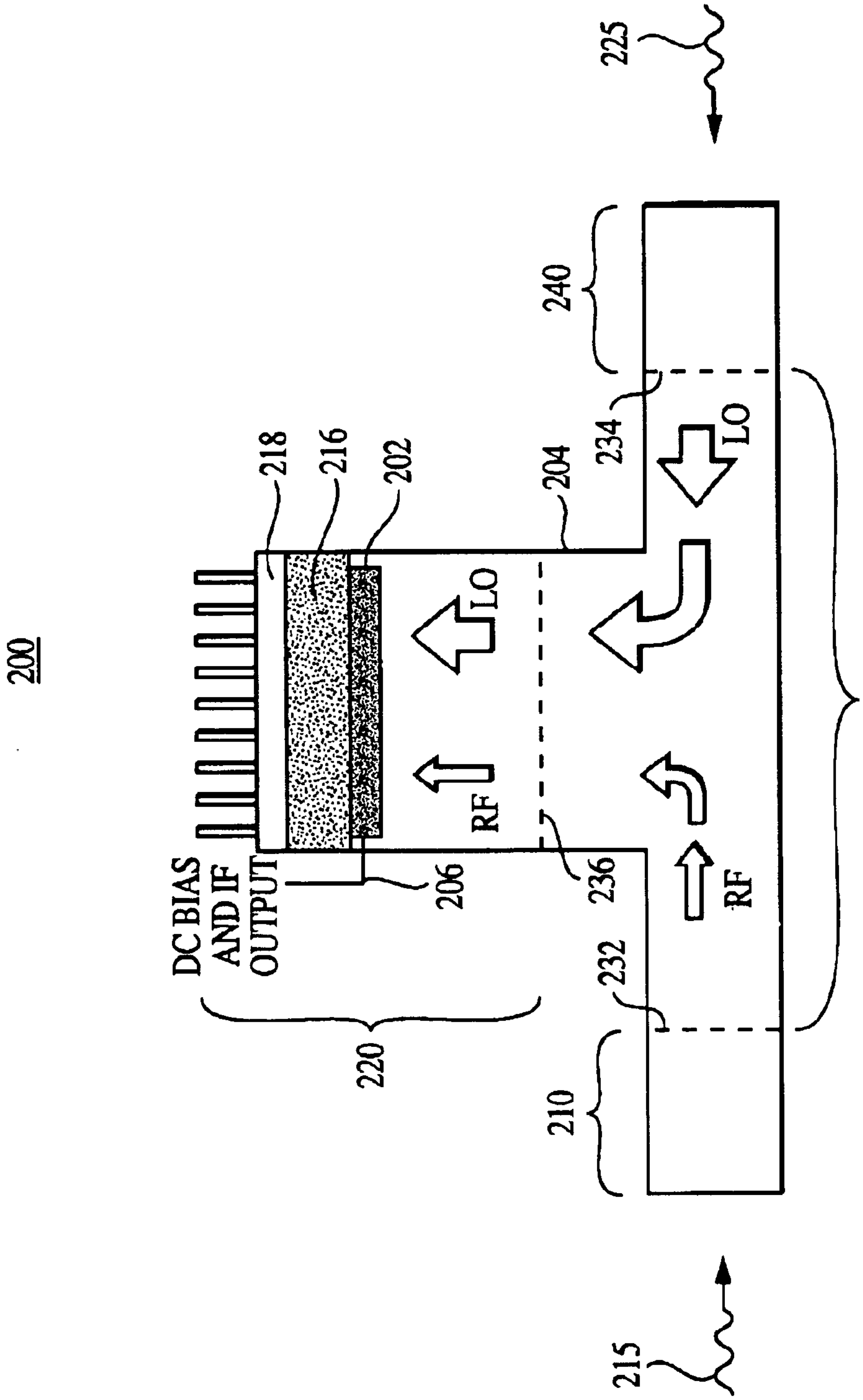
FIG. 4 is a cross-sectional view of another embodiment the quasi-optical reflection-mode waveguide system of the present invention, wherein the reflection-mode array is an RF mixer.

The present invention is also applicable to other types of quasi-optical arrays. FIG. 4 shows one such alternative system 200, wherein a quasi-optical reflection-mode mixer 202 is mounted in the waveguide enclosure 204. As above, the enclosure includes four components that are similar to the grid amplifier embodiment shown in FIG. 3, with the exception that now both energy coupling sections are input tuning sections. In particular, the enclosure includes an RF tuning section 210, a local oscillator (LO) tuning section 240, an OMT section 230, and an array mounting section 220. The OMT section has three ports 232, 234, and 236 that connect to the RF tuning section, LO tuning section and OMT section, respectively.

In operation, two input signals, an radio frequency (RF) signal 215 and a local oscillator (LO) signal 225, enter the OMT section 230 from the two single-polarization sections 210 and 240, respectively. The independent tuning sections can be used to optimize the RF and LO impedance match. These signals are then received by the mixer array 202, which is mounted on a dielectric heat spreader/tuner 216 and heat sink 218. The combined intermediate frequency (IF) output signal is taken from a low-frequency line 206 that can double as a dc bias line into the array.

Figure 5:
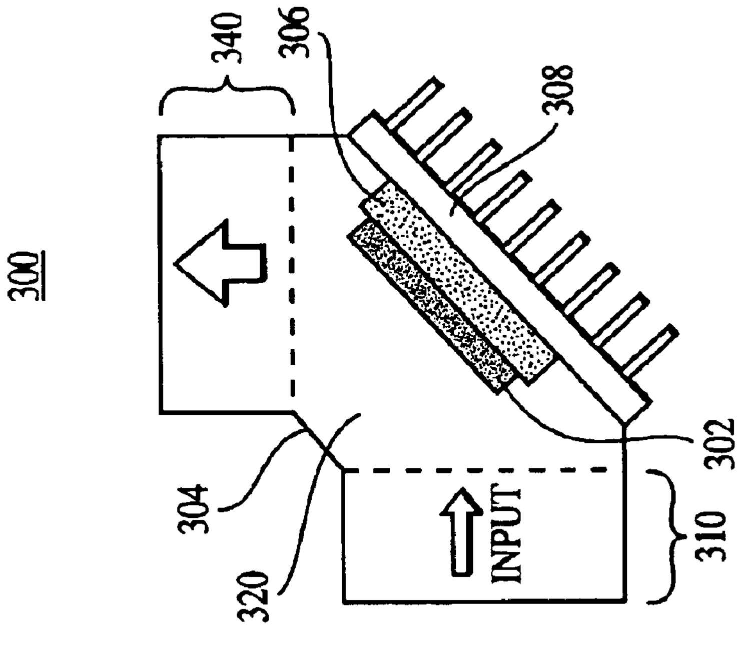
FIG. 5 is a cross-sectional view alternative structure to the quasi-optical reflection-mode amplifier waveguide system shown in FIG. 3, wherein the input and output tuning sections are at a right angle from each other.

As an alternative to FIG. 3, FIG. 5 shows a reflection-mode quasi-optical amplifier array system, 300 including an array amplifier 302 mounted to a heat spreader 306 and enclosed in a waveguide enclosure 304. The enclosure includes an input tuning section 310 and an output tuning section 340 that are offset from each other at an angle to further isolate the input and output beams. In this example, the sections are at a right angle from each other but need not be. Again, in this example, the input and output signals are orthogonally polarized. A three-port waveguide section 320 is coupled to the input and output tuning sections and to an array mounting section 308 and can support two orthogonally polarized modes. In this embodiment, the array mounting section 308 is a metal wall that acts as a heat sink with heat-radiating fins. Because the reflection array 302 with its tuner/heat spreader component 306 is mounted on the metal wall of the waveguide enclosure 304, the structure will tend to have very good thermal properties.

Having thus described exemplary embodiments of the invention, it will be apparent that further alterations, modifications, and improvements will also occur to those skilled in the art. Further, it will be apparent that the present technique and system is not limited for use with grid amplifiers or mixers, but with any reflection-mode quasi-optical array structure of any size and power level that can benefit from being integrated with a wave-guiding structure or enclosure. Thus, for example, either one or both of the energy coupling sections may not have tuning capabilities. Also, the system may not include an orthogonal mode transducer, but may use a simple "T" type wave-guiding structure. Accordingly, the invention is defined only by the following claims.

We claim:

1. An array system, comprising:

(a) a waveguide assembly, comprising:

(i) an array mounting section to which the array is mounted;

(ii) a first energy coupling section;

(iii) a second energy coupling section; and (iv) a three-port waveguide section having a first port connected to the first energy coupling section, a second port connected to the second energy coupling section, and a third port connected to the array mounting section; and (b) a quasi-optical reflection mode array enclosed by and mounted in the waveguide assembly, wherein the first energy coupling section is an RF input tuning section that accepts an RF input signal, the second energy coupling section is a local oscillator (LO) tuning section that accepts a local oscillator signal and the quasi-optical reflection mode array is a mixer that combines the RF and local oscillator signals to produce an intermediate frequency (IF) signal.

2. The array system of claim 1 further comprising an output line connected to the quasi-optical reflection mode array that provides an output for the IF signal.

3. An array system, comprising:

(a) a waveguide assembly, comprising:

(i) an array mounting section to which the array is mounted;

(ii) a first energy coupling section;

(iii) a second energy coupling section;

(iv) a three-port waveguide section having a first port connected to the first energy coupling section, a second port connected to the second energy coupling section, and a third port connected to the array mounting section, the third port being obliquely positioned relative to the first and second energy coupling section, wherein energy directed between the first coupling section and the array intersects the array at a non-normal incidence angle, and energy directed between the second coupling section and the array intersects the array at a non-normal incidence angle, such that separation of the energy through the first and second energy coupling sections is accomplished through angular separation of the energy beams, and where said angular separation is determined by the angular separation of the first and second energy coupling sections with respect to the array; and (b) a quasi-optical reflection mode array enclosed by and mounted in the waveguide assembly, the quasi-optical reflection mode array including a grid array of amplifiers.

* * * * *